US012706564B2

(12) United States Patent
Göbel

(10) Patent No.: US 12,706,564 B2
(45) Date of Patent: Aug. 11, 2026

(54) CONNECTION SOCKET SEMI-FINISHED PRODUCT, SOLAR MODULE SEMI-FINISHED PRODUCT, SOLAR MODULE, AND METHOD FOR PRODUCING A SOLAR MODULE

(71) Applicant: HANWHA Q CELLS GMBH, Bitterfeld-Wolfen (DE)

(72) Inventor: Marco Göbel, Bitterfeld-Wolfen (DE)

(73) Assignee: Hanwha Q Cells GmbH, Bitterfeld-Wolfen (DE)

( * ) Notice: Subject to any disclaimer, the term of this patent is extended or adjusted under 35 U.S.C. 154(b) by 279 days.

(21) Appl. No.: 18/554,493

(22) PCT Filed: Apr. 4, 2022

(86) PCT No.: PCT/DE2022/100255
§ 371 (c)(1),
(2) Date: Dec. 7, 2023

(87) PCT Pub. No.: WO2022/214139
PCT Pub. Date: Oct. 13, 2022

(65) Prior Publication Data

US 2024/0204721 A1 Jun. 20, 2024

(30) Foreign Application Priority Data

Apr. 9, 2021 (DE) .................... 10 2021 108 875.5

(51) Int. Cl.
*H02S 40/36* (2014.01)
*H10F 19/90* (2025.01)

(52) U.S. Cl.
CPC .......... *H02S 40/36* (2014.12); *H10F 19/902* (2025.01)

(58) Field of Classification Search
CPC .............................. H02S 40/36; H10F 19/902
See application file for complete search history.

(56) References Cited

U.S. PATENT DOCUMENTS

2011/0253192 A1 10/2011 Wang et al.
2012/0152325 A1 * 6/2012 Podkin ................. H10F 77/939 438/66

(Continued)

FOREIGN PATENT DOCUMENTS

CN 106788218 A * 5/2017 ............ H02S 40/34
CN 109327187 A 2/2019

(Continued)

OTHER PUBLICATIONS

Wang et al., CN 106788218 A, English Machine Translation. (Year: 2017).*

*Primary Examiner* — Tae-Sik Kang
(74) *Attorney, Agent, or Firm* — Christensen, Fonder, Dardi & Busse PLLC; John P. Fonder

(57) ABSTRACT

A connection socket semi-finished product for a solar module that includes a first and at least one additional connection socket sub-housing, each of which has a contact device with a positive-pole contact element and a negative-pole contact element. The connection socket sub-housing and the at least one additional connection socket sub-housing are designed to be structurally separate. The connection socket semi-finished product also includes at least one socket cable that produces an electric connection between the first contact device of the first connection socket sub-housing and the additional contact device of the additional connection socket sub-housing, and a first and a second solar module cable, each of which is connected to the first contact device or to the additional contact device or one of the additional contact devices.

13 Claims, 3 Drawing Sheets

(56) References Cited

U.S. PATENT DOCUMENTS

| | | | |
|---|---|---|---|
| 2013/0037077 | A1 | 2/2013 | Zhang |
| 2014/0246074 | A1 | 9/2014 | Doech et al. |

FOREIGN PATENT DOCUMENTS

| | | | |
|---|---|---|---|
| CN | 110729964 | A | 1/2020 |
| DE | 10 2009 022 944 | A1 | 12/2010 |
| EP | 3 089 356 | A1 | 11/2016 |

* cited by examiner

CONNECTION SOCKET SEMI-FINISHED PRODUCT, SOLAR MODULE SEMI-FINISHED PRODUCT, SOLAR MODULE, AND METHOD FOR PRODUCING A SOLAR MODULE

RELATED APPLICATIONS

The present application is a National Phase entry of PCT Application No. PCT/DE2022/100255, filed Apr. 4, 2022, which claims priority to German Patent Application No. 10 2021 108 875.5, filed Apr. 9, 2021, the disclosures of which are hereby incorporated by reference herein in their entirety.

FIELD OF THE INVENTION

The invention relates to a connection socket semi-finished product and a solar module semi-finished product, which are connectable to one another to produce the solar module, a solar module including the connection socket semi-finished product and the solar module semi-finished product, and a method for producing the solar module.

BACKGROUND OF THE INVENTION

A solar module typically includes a plate-shaped front side element, a plate-shaped rear side element, and an encapsulation material, which is arranged between the front side element and the rear side element. The solar module furthermore includes a plurality of solar cell strings made of solar cells typically electrically interconnected in series, which are arranged between the front side element and the rear side element and are permanently encapsulated in a weather-resistant manner in an encapsulation volume by means of the front side element, the rear side element, and the encapsulation material enclosing the solar cells in the form of a solar module laminate. The solar cell strings are typically electrically interconnected with the aid of electrical conductor elements, in particular in the form of transverse connectors, within the laminate. The electrical interconnection can be formed as required as solely a series circuit of the solar cell strings or as a combination of series circuit and parallel circuit of solar cell strings. The interconnected solar cell strings include electrical connection elements, of which at least one positive pole connection element and one negative pole connection element are led out of the encapsulation volume through an opening formed in the rear side element. Furthermore, a connection socket for the permanently weather-resistant sealed electrical contacting of the electrical connection elements led out of the encapsulation volume is fixed on the solar module in the region of this opening. The connection socket includes a housing, into which the connection elements are led and which is furthermore fillable using a filler material in order to permanently protect the connection elements in a weather-resistant manner from moisture and from corrosion. The connection socket is provided with a first solar module cable as the positive pole cable of the solar module and with a second solar module cable as the negative pole cable of the solar module, which are electrically contacted with the positive pole and the negative pole connection elements in the connection socket. The electrical energy generated by the solar module may be discharged via the first and the second solar module cable.

There is continuous economic pressure to reduce the production costs of solar modules.

SUMMARY

It is an object of the invention to provide a solar module which is producible more easily and cost-effectively in an alternative manner.

The object is achieved by a connection socket semi-finished product having the features of claim 1, a solar module semi-finished product having the features of claim 6, a solar module having the features of claim 9, and a method having the features of claim 11. Advantageous refinements and modifications are specified in the dependent claims.

The connection socket semi-finished product and the solar module semi-finished product can be prefinished in a simple manner. An operationally ready solar module is obtained by installing the connection socket semi-finished product according to the invention on the solar module semi-finished product according to the invention. In this case, connection socket partial housings of the connection socket semi-finished product and corresponding housing bases of the solar module semi-finished product for at least two connection sockets are permanently connected in a weather-resistant manner. The solar cell strings assigned to the two connection sockets in the interior of the solar module laminate are electrically interconnected by means of a socket cable extending outside the solar module laminate between the housings. In contrast to the prior art, the solar cell strings are interconnected entirely or partially outside the solar module laminate. Due to this solution, electrical conductor elements arranged in the solar module laminate for the electrical interconnection of the solar cell strings are superfluous. The arrangement of these electrical conductor elements before the lamination often has to be performed in manual work. In addition, it has to be ensured during the lamination that the desired spatial arrangement of the solar cell strings and their transverse connectors is retained. Due to the displacement of the transverse connectors out of the solar module laminate, the solar module formed in this manner by the connection socket semi-finished product and the solar module semi-finished product is significantly simplified and therefore more cost-effective to produce.

The invention relates to a connection socket semi-finished product for a solar module, including

- a first connection socket partial housing, which includes a first contact device having a first positive pole contact element and having a first negative pole contact element, arranged and designed for electrically contacting one or more positive pole connection elements and one or more negative pole connection elements of solar cell strings of a solar module laminate,
- at least one further connection socket partial housing, which includes a further contact device having a further positive pole contact element and a further negative pole contact element, arranged and designed for electrically contacting one or more positive pole connection elements and one or more negative pole connection elements of solar cell strings of a solar module laminate, wherein the first connection socket partial housing and the at least one or the further connection socket partial housings are formed structurally separate from one another,
- at least one socket cable, which establishes an electrical interconnection between the first contact device of the first connection socket partial housing and the further contact device of the further connection socket partial housing,
- a first solar module cable, which is interconnected with the first contact device or with the or one of the further contact devices such that the first solar module cable forms a positive pole connection, which forms the first contact device connected via the at least one socket cable in electrical interconnection and the further contact device or the further contact devices, and a second solar module cable, which is interconnected with the first contact device or with the or one of the further contact devices such that the second solar module cable forms a negative pole connection, which forms the first contact device connected via the at least one socket cable in electrical interconnection and the further contact device or the further contact devices.

The connection socket semi-finished product having its at least two connection socket partial housings provides a simple interconnection of the solar cell strings of the solar module semi-finished product upon connection to the solar module semi-finished product. The connection socket semi-finished product can be prefinished in a simple manner before the installation on the solar module semi-finished product. This manufacturing can be carried out in a separate manufacturing facility, for example, by a supplier. The at least two connection socket partial housings represent two structurally separate partial housings of two different connection sockets but are electrically interconnected via the socket cable. Due to this structure, the integration and lamination of electrical conductor elements such as transverse connectors for the electrical interconnection of the solar cell strings into the interior of the solar module laminate of the solar module semi-finished product is no longer required.

Preferably, both the first solar module cable and the second solar module cable are connected to the first contact device, while the at least one further contact device is not connected to a solar module cable, i.e., the at least one further contact device is formed free of solar module cables. The first connection socket partial housing is then, upon installation on a solar module semi-finished product, part of a main connection socket of the solar module thus formed. Solar module cables in the form of a negative pole cable of the solar module and a positive pole cable of the solar module lead out of this main connection socket and permit the solar module to be interconnected with further solar modules. The at least one further connection socket partial housing then becomes part of a satellite connection socket which, during operation of the solar module, can conduct the generated electrical current of the solar cell strings assigned thereto via the socket cable to the main connection socket.

The first or further contact device(s) each include a first or further positive pole contact element and a first or further negative pole contact element. The respective contact device can exclusively consist in a minimal variant of the respective positive pole contact element and the respective negative pole contact element. Alternatively, the respective contact device can include, in addition to the respective positive pole contact element and the respective negative pole contact element, still further structural and functional components such as an electrical contact band and electronic components.

The above-described electrical interconnections are preferably a series circuit in each case. The at least one socket cable preferably establishes a series circuit between the first contact device of the first connection socket partial housing and the at least one further contact device of the at least one further connection socket partial housing. However, other variants are also possible and may be implemented easily via the electrical interconnection of the solar cell strings implemented externally with the aid of the connection socket semi-finished product.

The first and/or the at least one further connection socket partial housing preferably furthermore contain one or more electrical and/or electronic components. The electrical and/or electronic components may thus be exchanged easily if needed when the connection socket semi-finished product is combined with a solar module semi-finished product to form a solar module. The electrical and/or electronic components are preferably arranged exchangeably in the first and/or at least one further connection socket partial housing. In the event of a defect, the affected connection socket partial housing thus does not have to be replaced, but rather only the defective component. The electrical and/or electronic components are preferably all arranged in the first connection socket partial housing, which is part of the main connection socket, upon integration into the solar module, while the further connection socket partial housing or housings are free of electrical and/or electronic components with the exception of the required positive pole and negative pole contact elements.

In one preferred embodiment, the first connection socket partial housing contains at least one bypass diode for one or more solar cell strings of a solar module laminate. Alternatively or additionally, the at least one further connection socket partial housing preferably contains at least one bypass diode for a solar cell string of a solar module. If current should no longer flow in one or more solar cell strings during operation of the solar module, for example, due to soiling or shade, the bypass diode can avoid overheating and defects. In one preferred embodiment, the first connection socket partial housing contains at least one bypass diode for at least one solar cell string of a solar module laminate and the first contact device is electrically interconnected with the first solar module cable and the second solar module cable. The at least one further connection socket partial housing is free of bypass diodes and the at least one further contact device is not connected to the first solar module cable and the second solar module cable, i.e., it is formed free of solar module cables.

The first connection socket partial housing preferably includes activation and/or analysis electronics for a solar module. Alternatively or additionally, the at least one further connection socket partial housing preferably includes activation and/or analysis electronics for a solar module. The first connection socket partial housing is preferably designed having activation and/or analysis electronics for a solar module, while the at least one further connection socket partial housing is free of activation and/or analysis electronics.

In one preferred embodiment, the first connection socket partial housing is formed in one piece. Alternatively or additionally, the at least one further connection socket partial housing is preferably formed in one piece. The first connection socket partial housing and the at least one further connection partial housing are preferably each formed in one piece. The assembly to produce the solar module is thus further simplified.

In one preferred embodiment, the first connection socket partial housing and/or the at least one further connection socket partial housing are each trough-shaped. Sufficient space is thus provided for electrical and/or electronic components, which can be integrated therein.

The first connection socket partial housing and the at least one further connection socket partial housing preferably includes socket detent elements, which are designed to latch with corresponding detent elements of a first housing base or a further housing base of a solar module semi-finished product. The solar module is thus producible in a simple manner by means of a simple but secure type of connection.

Furthermore, the invention relates to a solar module semi-finished product, including a plate-shaped front side element and a plate-shaped rear side element, wherein the rear side element includes at least two openings, an encapsulation material, which is arranged between the front side element and the rear side element, a plurality of solar cell strings made up of electrically interconnected solar cells, which are arranged between the front side element and the rear side element and are encapsulated in a weather-resistant manner in an encapsulation volume by means of the front side element, the rear side element, and the encapsulation material enclosing the solar cells in the form of a solar module laminate, positive pole connection elements and negative pole connection elements of the solar cell strings, which are led out per solar cell string as a connection pair in the form of a positive pole connection element and an associated negative pole connection element from the encapsulation volume through one of the at least two openings, wherein the connection pairs are each led out through the respective spatially closest one of the at least two openings and there is no electrical contact between the solar cell strings within the laminate, a first housing base fixed via one of the at least two openings on the solar module semi-finished product, designed to produce a permanently weatherproof housing in connection with an attached connection socket partial housing, and at least one further housing base fixed via the other of the at least two openings on the solar module semi-finished product, designed to produce a permanently weatherproof housing in connection with an attached further connection socket partial housing.

In place of electrical conductor elements, for example, in the form of transverse connectors for interconnecting the solar cell strings in the interior of the solar module laminate, the solar cell strings are interconnected by means of the at least two housing bases in connection with the connection socket semi-finished product, which includes at least one socket cable, in order to electrically interconnect the solar cell strings outside the laminate in the desired manner. Integrating the electrical conductor elements in the solar module semi-finished product for electrically interconnecting the solar cell strings thus becomes superfluous. The solar module laminate of the solar module semi-finished product is preferably designed free of transverse connectors; i.e., it includes electrical conductor elements in the form of transverse connectors in the interior of the solar module laminate. Therefore, beyond electrical conductor elements for forming the solar cell strings themselves, no further electrical conductor elements for interconnecting the solar cell strings formed with one another are present within the solar module laminate. It is thus more easily and cost-effectively producible than solar modules and solar module semi-finished products known from the prior art.

In one preferred embodiment, the openings are positioned in the rear side element of the solar module semi-finished product such that they come to rest above a starting section and above an end section of at least one solar cell string. The connection pair can thus be led on a comparatively short path easily through the opening out of the solar module laminate.

The first housing base and the at least one further housing base preferably include further detent elements which are designed to latch with the first connection socket partial housing or the further connection socket partial housing of the connection socket semi-finished product. A permanently weather-resistant connection socket may thus be produced in a simple manner.

The first and the at least one further housing base are preferably fixed on the rear side element, for example, adhesively bonded thereto. They may thus be applied easily and in an automated manner to the rear side element during the production of the solar module semi-finished product. The first and the at least one further housing base are preferably plate-shaped. The first and at least one further housing base are preferably free of electrical and/or electronic components, when it is neglected that the electrical connection pair of the assigned solar cell strings is led through them. The first housing base and the at least one further housing base preferably each include at least one hole, through which the connection elements of the solar cell strings can be led.

Furthermore, the invention relates to a solar module, which includes the solar module semi-finished product according to one or more of the above-described embodiments and the connection socket semi-finished product attached to the first housing base and to the further housing base according to one or more of the above-described embodiments.

In addition to the simple producibility of the solar module, it is an advantage that the connection socket semi-finished product and its electrical components may be exchanged easily if needed, for example, in the event of a defect.

In one preferred embodiment, the first connection socket partial housing is arranged and fixed on the first housing base and the further connection socket partial housing is arranged and fixed on the further housing base such that they form a first connection socket or a further connection socket, which are each closed permanently in a weather-resistant manner.

The first connection socket partial housing and the first housing base form the first connection socket, and the at least one further connection socket partial housing and the at least one further housing base form the at least one further connection socket. The first connection socket is preferably the main connection socket and the at least one further connection socket is preferably a satellite connection socket. A main connection socket in the meaning of the invention is a connection socket which is electrically connected to the first solar module cable and the second solar module cable, while a satellite connection socket is a connection socket which is not electrically connected to a solar module cable, i.e., it is formed free of solar module cables. Since the satellite connection socket is connected to the main connection socket via at least one socket cable, it is capable of conducting current into the main connection socket during operation. The solar module preferably includes one main connection socket and two satellite connection sockets.

The positive pole and negative pole connection elements of the solar cell strings and the positive pole and negative pole connection elements of the connection socket semi-finished product are preferably made complementary such that they form an electrical contact when the connection socket semi-finished product is attached to the solar module semi-finished product. For example, they are electrically connected by means of a plug connection. The positive pole and negative pole connection elements of the connection socket semi-finished product are preferably designed as female receptacle elements, and the positive pole and negative pole connection elements of the solar cell strings are designed as male plug elements.

The solar module semi-finished product and the solar module are preferably designed as a wafer solar module semi-finished product or as a wafer solar module. A wafer solar module differs from a thin-film solar module in particular in that it includes wafer-based solar cells and not thin-film solar cells. Wafer-based solar cells have a thickness greater than 100 μm or, for example, in the range of 180 to 300 μm, while thin-film solar cells have a thickness in the range of a few microns. The solar cells can be half, third, quarter, fifth, or full cells.

The invention furthermore relates to a method for producing a solar module, including the following steps

- providing a solar module semi-finished product according to one or more of the above-described embodiments,
- arranging a connection socket semi-finished product according to one or more of the above-described embodiments so that the first housing base of the solar module semi-finished product is connected to the first connection socket partial
- housing and the at least one further housing base of the solar module semi-finished product is connected to the at least one further connection socket partial housing.

The above-described first connection socket and the at least one further above-described connection socket result due to the connection.

BRIEF DESCRIPTION OF THE DRAWINGS

The invention will be explained hereinafter on the basis of exemplary embodiments with reference to the figures. In the schematic figures, which are not to scale.

DETAILED DESCRIPTION

Figure 1:
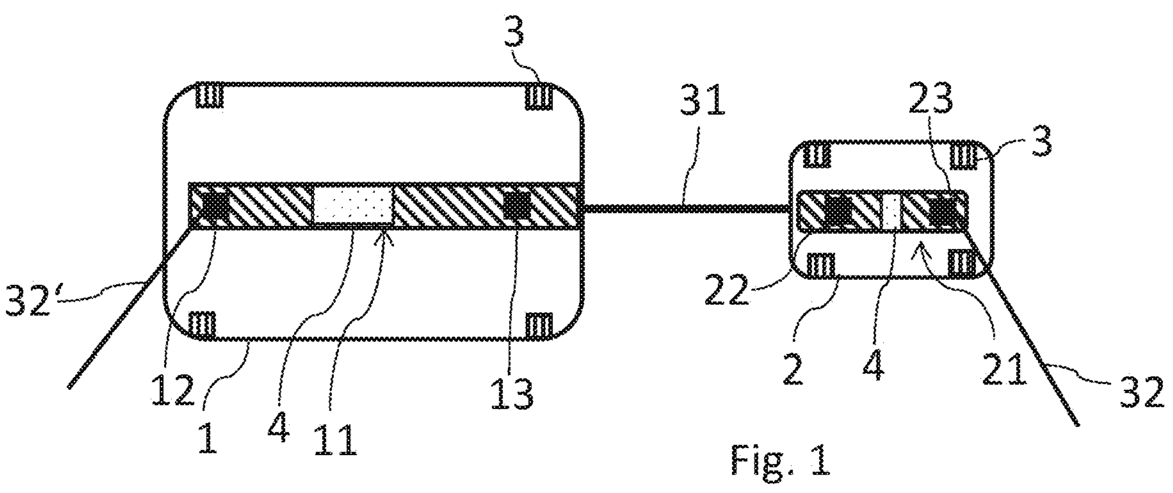
FIG. 1 shows a sectional view of a connection socket semi-finished product according to the invention parallel to a module plane defined by an associated solar module.

FIG. 1 shows a sectional view of a connection socket semi-finished product according to the invention parallel to a module plane defined by an associated solar module semi-finished product. The connection socket semi-finished product for a solar module semi-finished product includes a first connection socket partial housing 1, which receives a first contact device 11 having a first positive pole contact element 12 and having a first negative pole contact element 13 and a bypass diode 4. The first positive pole contact element 12 and the first negative pole contact element 13 are arranged and designed for electrically contacting one or more positive pole connection elements (not shown) and one or more negative pole connection elements (not shown) of solar cell strings (not shown), which are led out of the solar module laminate of a solar module semi-finished product. The bypass diode 4 is arranged and designed in the first contact device 11 for one or more solar cell strings of a solar module semi-finished product.

The connection socket semi-finished product furthermore includes a further connection socket partial housing 2, which receives a further contact device 21 having a further positive pole contact element 22 and a further negative pole contact element 23 and a further bypass diode 4. The further positive pole contact element 22 and the further negative pole contact element 23 are arranged and designed for electrically contacting one or more positive pole connection elements (not shown) and one or more negative pole connection elements (not shown) of solar cell strings from the solar module laminate of a solar module semi-finished product (not shown). The bypass diode 4 is arranged and designed for one or more solar cell strings of the solar module semi-finished product. The first connection socket partial housing 1 and the further connection socket partial housing 2 are formed structurally separate from one another.

Furthermore, the connection socket semi-finished product includes a socket cable 31, which establishes an electrical interconnection between the first contact device 11 of the first connection socket partial housing 1 and the further contact device 21 of the further connection socket partial housing 2.

The connection socket semi-finished product furthermore includes a first solar module cable 32, which is interconnected with the further contact device 21 such that the solar module cable 32 forms a positive pole connection, which forms the first contact device 11 connected in electrical interconnection via the at least one socket cable 31 and the further contact device 21.

Furthermore, the connection socket semi-finished product includes a second solar module cable 32', which is interconnected with the first contact device 11 such that the further solar module cable 32' forms a negative pole connection, which forms the first contact device 11 connected in electrical interconnection via the at least one socket cable 31 and the further contact device 21.

The first connection socket partial housing 1 and the further connection socket partial housing 2 each include socket detent elements 3, which are each structurally formed to latch with complementary detent elements of housing bases (not shown) of a solar module semi-finished product.

Figure 2:
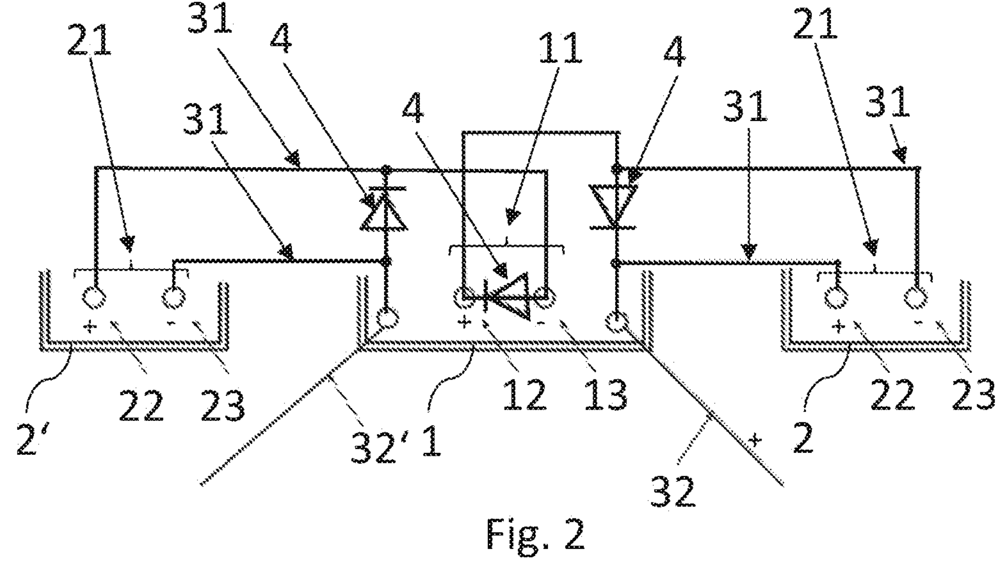
FIG. 2 shows an electrical circuit diagram of a further connection socket semi-finished product according to the invention.

FIG. 2 shows an electrical circuit diagram of a further connection socket semi-finished product according to the invention. The connection socket semi-finished products shown in FIG. 2 corresponds to the connection socket semi-finished products shown in FIG. 1 with the difference that in addition to a first further connection socket partial housing 2, it includes a further second connection socket partial housing 2'. Furthermore, the first connection socket partial housing 1 includes two further bypass diodes 4, while the first further connection socket partial housing 2 and also the second further connection socket partial housing 2' each do not contain a solar cell string bypass diode. Finally, the solar module cable 32 is connected to the first connection socket partial housing 1 instead of to the first further connection socket partial housing 2. The further connection socket partial housing 2' includes a further contact device 21 having a further positive pole contact element 22 and a further negative pole contact element 23. The further positive pole contact element 22 and the further negative pole contact element 23 are arranged and designed for electrically contacting one or more positive pole connection elements (not shown) and one or more negative pole connection elements (not shown) of solar cell strings (not shown) of a solar module laminate. The first connection socket partial housing 1 and the further connection socket partial housings 2, 2' are formed structurally separate from one another.

Figure 3:
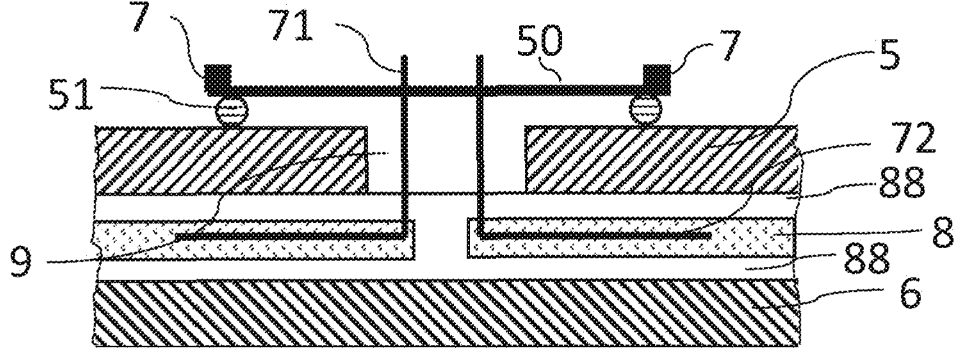
FIG. 3 shows a sectional view of an embodiment of a solar module semi-finished product according to the invention perpendicular to a module plane defined by the solar module semi-finished product.

FIG. 3 shows a sectional view of an embodiment of a solar module semi-finished product according to the invention perpendicular to a module plane defined by the solar module semi-finished product. The solar module semi-finished product includes a plate-shaped front side element 6 and a plate-shaped rear side element 5. Three openings 9 are formed in the rear side element 5, of which one is shown. Furthermore, the solar module semi-finished product includes an encapsulation material 88, which is arranged between the front side element 6 and the rear side element 5. A plurality of solar cell strings (not shown) made of electrically interconnected solar cells 8 are arranged in the encapsulation material 88. The solar cell strings are permanently encapsulated in the weather-resistant manner in an encapsulation volume by means of the front side element 6, the rear side element 5, and the encapsulation material 88 enclosing the solar cells 8 in the form of a solar module laminate.

The solar cell strings include positive pole connection elements 71 and negative pole connection elements 72, which are each led out of the encapsulation volume through one of the three openings 9 per solar cell string as a connection pair in the form of the positive pole connection element 71 and the associated negative pole connection element 72, wherein the connection pairs are each led out through the respective spatially closest one of the at least two openings 9 and no electrical contact exists between the solar cell strings within the laminate.

The solar module semi-finished product furthermore includes a first housing base 50, which is fixed over one of the three openings 9 on the rear side element 5, for example, by means of adhesive 51 and is designed to produce a permanently weatherproof housing in connection with an attached connection socket partial housing (not shown). The first housing base includes holes (not shown), through which the connection elements 71, 72 of solar cell strings are led as a connection pair. Furthermore, the first housing base includes base detent elements 7, which are designed to latch with detent elements 3 of the first connection socket partial housing 1 shown in FIG. 2.

Figure 4:
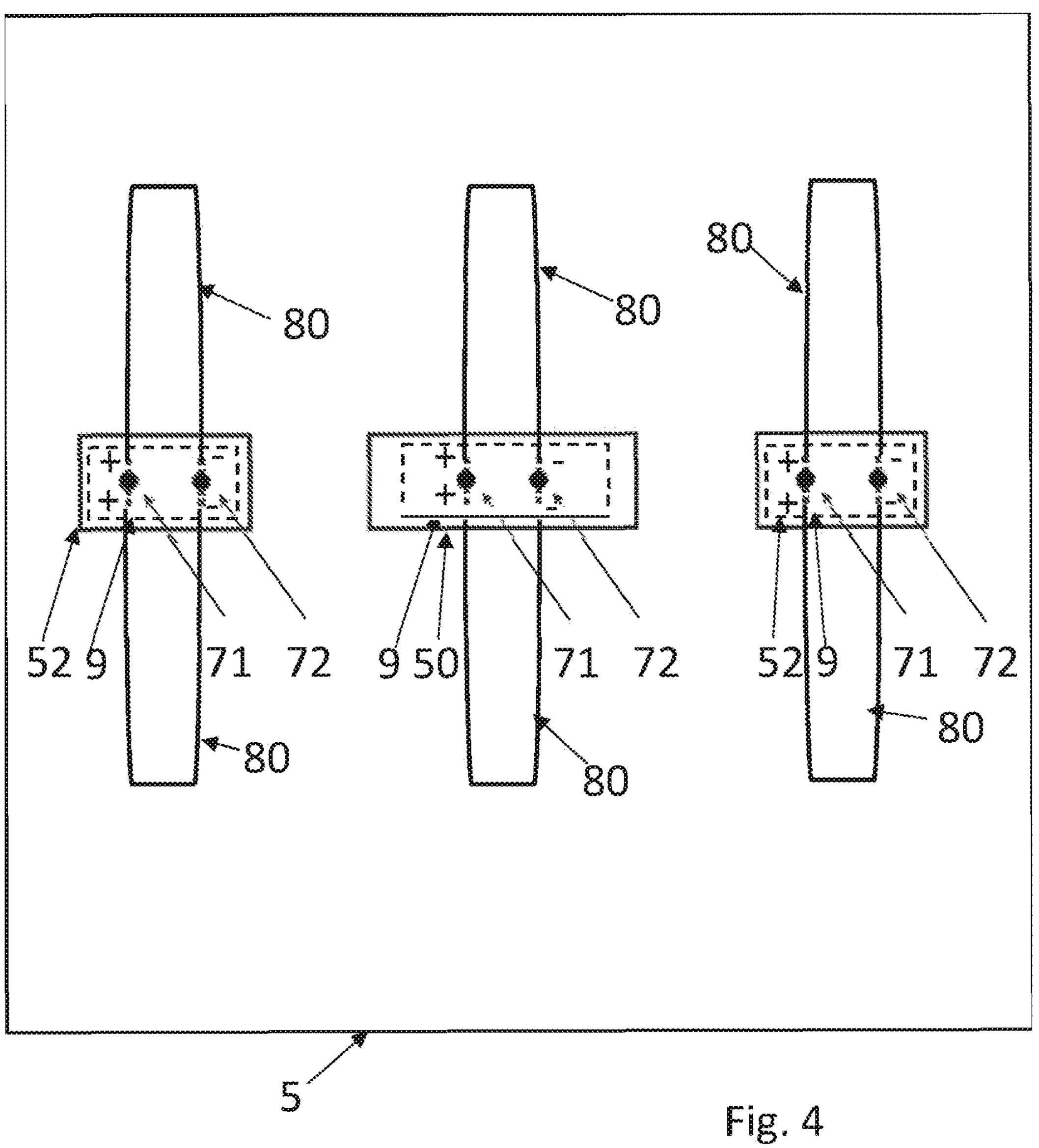
FIG. 4 shows a top view of the solar module semi-finished product shown in FIG. 3.

FIG. 4 shows a top view of the solar module semi-finished product shown in FIG. 3. The solar module semi-finished product includes three pairs of solar cell strings 80. These are shown solely schematically as loops above and below three openings 9 on the rear side of the solar module semi-finished product. The positive pole connection elements 71 and negative pole connection elements 72 of the solar cell strings 80 are each led through one of the three openings 9 out of the solar module laminate of the solar module semi-finished products. Furthermore, the solar module semi-finished product includes two further housing bases 52, which are designed to produce a permanently weatherproof connection socket in connection with one attached further connection socket partial housing (not shown) in each case. The further housing bases 52 are each fixed over one of the other two openings 9 on the rear side element 5. The openings 9 are shown by dashed lines, because they are below the housing bases 50, 52 in this top view and are therefore concealed.

Figure 5:
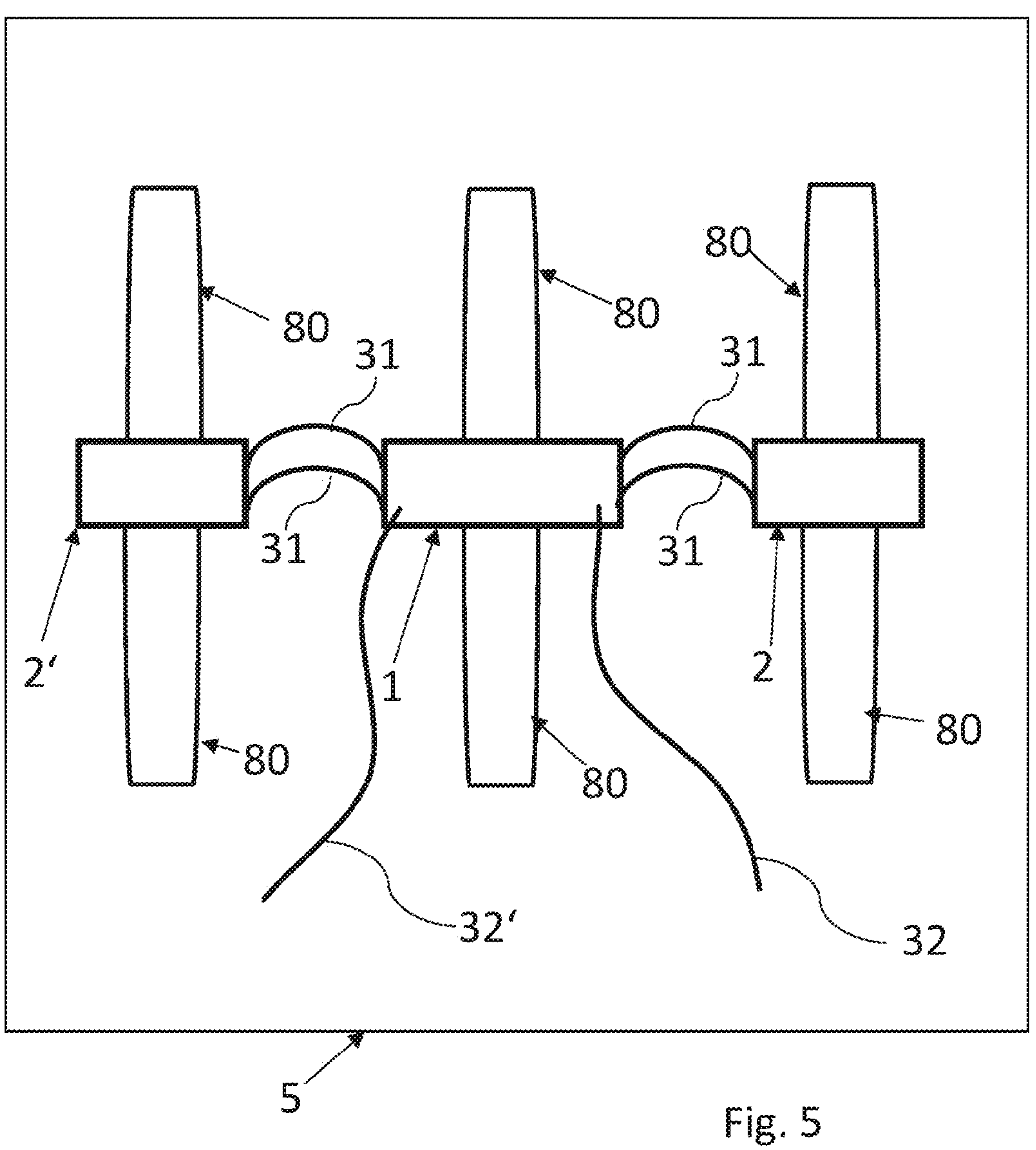
FIG. 5 shows a top view of a solar module formed from the solar module semi-finished product from FIG. 4 with an attached three-part connection socket semi-finished product.

To produce an embodiment of the solar module according to the invention, the solar module semi-finished products shown in FIGS. 3 and 4 is provided and then the three-part connection socket semi-finished product shown in FIG. 2 is arranged such that the first housing base 50 of the solar module semi-finished product is connected to the first connection socket partial housing 1 by latching and the two further housing bases 52 of the solar module semi-finished product are each connected to one of the two further connection socket partial housings 2 by latching. This solar module is shown by way of example in FIG. 5. The three-part connection socket semi-finished product forms with its partial housings (1, 2, 2'), together with the associated housing bases (50, 52), permanently weatherproof closed housings and the socket cables 31 between these housings interconnect, outside the solar module laminate, the solar cell strings 80 arranged in the interior of the solar module laminate in the desired electrical interconnection.

LIST OF REFERENCE SIGNS

- 1 first connection socket partial housing
- 2 further connection socket partial housing
- 2' further connection socket partial housing
- 3 socket detent element
- 4 bypass diode
- 5 rear side element
- 6 front side element
- 7 base detent element
- 8 solar cell
- 9 opening
- 11 first contact device
- 12 first positive pole contact element
- 13 first negative pole contact element
- 21 further contact device
- 22 further positive pole contact element
- 23 further negative pole contact element
- 31 socket cable
- 32 first solar module cable, positive pole cable of the solar module
- 32' second solar module cable, negative pole cable of the solar module
- 50 first housing base
- 51 adhesive
- 52 further housing base
- 71 positive pole connection element
- 72 negative pole connection element
- 80 solar cell string
- 88 encapsulation material

The invention claimed is:

1. A connection socket semi-finished product for a solar module, including:

a first connection socket partial housing, which includes a first contact device having a first positive pole contact element and having a first negative pole contact element, arranged and designed for electrically contacting one or more positive pole connection elements and one or more negative pole connection elements of one or more first solar cell strings of a solar module laminate, at least one further connection socket partial housing, which includes a further contact device having a further positive pole contact element and a further negative pole contact element, arranged and designed for electrically contacting one or more further positive pole connection elements and one or more further negative pole connection elements of one or more further solar cell strings of the solar module laminate, wherein the first connection socket partial housing and the at least one further connection socket partial housing are formed structurally separate from one another, at least one socket cable, which establishes an electrical connection between the first contact device of the first connection socket partial housing and the further contact device of the further connection socket partial housing, a first solar module cable, which is interconnected with the first contact device or with the further contact device such that the first solar module cable forms a positive pole connection of the first contact device connected via the at least one socket cable in electrical interconnection with the further contact device, and a second solar module cable, which is interconnected with the first contact device or with the further contact device such that the second solar module cable forms a negative pole connection of the first contact device connected via the at least one socket cable in electrical interconnection with the further contact device.

2. The connection socket semi-finished product as claimed in claim 1, wherein the first connection socket partial housing contains at least one bypass diode for a solar cell string of the one or more first solar cell strings of the solar module laminate and/or that the at least one further connection socket partial housing contains at least one bypass diode for a solar cell string of the one or more first solar cell strings of the solar module laminate.

3. The connection socket semi-finished product as claimed in claim 1, wherein the first connection socket partial housing includes activation and/or analysis electronics for the solar module and/or that the at least one further connection socket partial housing includes activation and/or analysis electronics for the solar module.

4. The connection socket semi-finished product as claimed in claim 1, wherein the first connection socket partial housing and/or the at least one further connection socket partial housing are each formed in one piece.

5. The connection socket semi-finished product as claimed in claim 1, wherein the first connection socket partial housing and/or the at least one further connection socket partial housing are each trough-shaped.

6. The connection socket semi-finished product as claimed in claim 1, wherein the first connection socket partial housing and the at least one further connection socket partial housing include socket detent elements, which are designed to latch with the first housing base or the at least one further housing base of the solar module semi-finished product or that the first housing base and the at least one further housing base include further base detent elements, which are designed to latch with the first connection socket partial housing or the further connection socket partial housing.

7. A solar module semi-finished product, including:

a plate-shaped front side element and a plate-shaped rear side element, wherein the rear side element includes at least two openings, an encapsulation material, which is arranged between the front side element and the rear side element, a plurality of solar cell strings made of electrically interconnected solar cells, which are arranged between the front side element and the rear side element and are encapsulated in an encapsulation volume in a weather-resistant manner by means of the front side element, the rear side element, and the encapsulation material enclosing the solar cells in the form of a solar module laminate, positive pole connection elements and negative pole connection elements of the solar cell strings which are led out of the encapsulation volume through one of the at least two openings per solar cell string as a connection pair in the form of a positive pole connection element and an associated negative pole connection element, wherein connection pairs are each led out through respective spatially closest one of the at least two openings and there is no electrical contact between the solar cell strings within the solar module laminate, a first housing base fixed over one of the at least two openings on the solar module semi-finished product and designed to produce a permanently weatherproof housing in connection with an attached connection socket partial housing, and at least one further housing base fixed over the other of the at least two openings on the solar module semi-finished product and designed to produce a permanently weatherproof housing in connection with an attached further connection socket partial housing.

8. The solar module semi-finished product as claimed in claim 7, wherein the at least two openings are positioned in the rear side element such that the at least two openings come to rest over a starting section and over an end section of at least one solar cell string.

9. The solar module semi-finished product as claimed in claim 7, wherein the first housing base and the at least one further housing base include detent elements.

10. A solar module, including the solar module semi-finished product as claimed in claim 7 and a connection socket semi-finished product which is attached to the first housing base and to the at least one further housing base, wherein the connection socket semi-finished product includes:

a first connection socket partial housing, which includes a first contact device having a first positive pole contact element and having a first negative pole contact element, arranged and designed for electrically contacting one or more positive pole connection elements and one or more negative pole connection elements of one or more first solar cell strings of a solar module laminate, at least one further connection socket partial housing, which includes a further contact device having a further positive pole contact element and a further negative pole contact element, arranged and designed for electrically contacting one or more further positive pole connection elements and one or more further negative pole connection elements of one or more further solar cell strings of the solar module laminate, wherein the first connection socket partial housing and the at least one further connection socket partial housing are formed structurally separate from one another, at least one socket cable, which establishes an electrical connection between the first contact device of the first connection socket partial housing and the further contact device of the further connection socket partial housing, a first solar module cable, which is interconnected with the first contact device or with the further contact device such that the first solar module cable forms a positive pole connection of the first contact device connected via the at least one socket cable electrical interconnection with the further contact device, and a second solar module cable, which is interconnected with the first contact device or with the further contact device such that the second solar module cable forms a negative pole connection of the first contact device connected via the at least one socket cable in electrical interconnection with the further contact device.

11. The solar module as claimed in claim 10, wherein the connection socket partial housing is arranged and fixed on the first housing base and the further connection socket partial housing is arranged and fixed on the further housing base such that the connection socket partial housing arranged and fixed on the first housing base forms a first connection socket and the further connection socket partial housing arranged and fixed on the further housing base forms a further connection socket, each of the first connection socket and the further connection socket permanently closed in a weather-resistant manner.

12. A method for producing a solar module, including the following steps:

providing the solar module semi-finished product as claimed in claim 7, arranging a connection socket semi-finished product, so that the first housing base of the solar module semi-finished product is connected to a first connection socket partial housing of the connection socket semi-finished product and the at least one further housing base of the solar module semi-finished product is connected to at least one further connection socket partial housing of the connection socket semi-finished product, wherein the connection socket semi-finished product includes:

the first connection socket partial housing, which includes a first contact device having a first positive pole contact element and having a first negative pole contact element, arranged and designed for electrically contacting one or more positive pole connection elements and one or more negative pole connection elements of one or more first solar cell strings of a solar module laminate, the at least one further connection socket partial housing, which includes a further contact device having a further positive pole contact element and a further negative pole contact element, arranged and designed for electrically contacting one or more further positive pole connection elements and one or more further negative pole connection elements of one or more further solar cell strings of the solar module laminate, wherein the first connection socket partial housing and the at least one further connection socket partial housing are formed structurally separate from one another, at least one socket cable, which establishes an electrical connection between the first contact device of the first connection socket partial housing and the further contact device of the further connection socket partial housing, a first solar module cable, which is interconnected with the first contact device or with the further contact device such that the first solar module cable forms a positive pole connection of the first contact device connected via the at least one socket cable in electrical interconnection with the further contact device, and a second solar module cable, which is interconnected with the first contact device or with the further contact device such that the second solar module cable forms a negative pole connection of the first contact device connected via the at least one socket cable in electrical interconnection with the further contact device.

13. A solar module, including the solar module semi-finished product as claimed in claim 7 and a connection socket semi-finished product which is attached to the first housing base and to the at least one further housing base, wherein the connection socket semi-finished product comprises:

the attached connection socket partial housing;

the attached further connection socket partial housing; and at least one socket cable connecting the first connection socket partial housing to the at least one further connection socket partial housing, including electrically connecting a first contact device of the first connection socket partial housing and a further contact device of the further connection socket partial housing.

* * * * *